(12) United States Patent
Haché

(10) Patent No.: US 9,342,633 B2
(45) Date of Patent: May 17, 2016

(54) SYSTEM AND METHOD FOR MANUFACTURING WINDOW FRAMES

(71) Applicant: Joseph François Haché, Shippagan (CA)

(72) Inventor: Joseph François Haché, Shippagan (CA)

( * ) Notice: Subject to any disclaimer, the term of this patent is extended or adjusted under 35 U.S.C. 154(b) by 479 days.

(21) Appl. No.: 13/815,979

(22) Filed: Mar. 20, 2013

(65) Prior Publication Data

US 2014/0288688 A1 Sep. 25, 2014

Related U.S. Application Data

(60) Provisional application No. 61/848,939, filed on Jan. 16, 2013.

(51) Int. Cl.
| | | |
|---|---|---|
| *E06B 3/54* | (2006.01) | |
| *G06F 17/50* | (2006.01) | |
| *B21D 53/74* | (2006.01) | |
| *G05B 19/418* | (2006.01) | |

(52) U.S. Cl.
CPC ................ *G06F 17/50* (2013.01); *B21D 53/74* (2013.01); *G05B 19/4183* (2013.01); *Y02P 90/04* (2015.11); *Y02P 90/10* (2015.11)

(58) Field of Classification Search
None
See application file for complete search history.

(56) References Cited

U.S. PATENT DOCUMENTS

| | | | |
|---|---|---|---|
| 5,022,143 A | 6/1991 | Kautt | |
| 6,294,044 B1 | 9/2001 | Schwaiger | |
| 6,591,488 B1 | 7/2003 | Tachibana | |
| 6,860,181 B2 | 3/2005 | Aubourg et al. | |
| 7,966,714 B2 | 6/2011 | Dick et al. | |
| 8,010,220 B1* | 8/2011 | Ames | G06Q 10/06 235/384 |
| 2003/0079964 A1* | 5/2003 | Kilabarda | B65G 13/02 198/678.1 |
| 2006/0059687 A1* | 3/2006 | Robin | B21D 53/74 29/897.32 |
| 2006/0096835 A1* | 5/2006 | Bellezza | B62D 65/18 198/345.3 |
| 2007/0270996 A1* | 11/2007 | Roise | G06Q 10/06 700/171 |
| 2007/0276526 A1 | 11/2007 | Swanson | |

* cited by examiner

*Primary Examiner* — Mohammad Ali
*Assistant Examiner* — Bernard G Lindsay
(74) *Attorney, Agent, or Firm* — Mario Theriault

(57) ABSTRACT

An array of boxes in one or more carts is closely associated with addresses in a database of a computer. This computer-box association is used to keep track of the sequence, placement and presentation of each window frame element to each workstation. This association is maintained until these frame elements are assembled into rectangular window frames. Then, individual window frames are tracked into other workstations using bar code labels. Temporary storage of frame elements between workstations constitute work banks to each workstation. In another aspect, the lengths of frame elements are adjusted to compensate for the melt factor of the specific welding head in which a joint will be made.

12 Claims, 6 Drawing Sheets

SYSTEM AND METHOD FOR MANUFACTURING WINDOW FRAMES

This application claims the benefit of U.S. Provisional Application No. 61/848,939 filed Jan. 16, 2013.

FIELD OF THE INVENTION

This invention pertains to the manufacturing of vinyl or aluminum window frames, and more particularly, it pertains to the tracking of every frame element during the manufacturing of window frames, and the generation of machine and operator instructions for each frame element.

BACKGROUND OF THE INVENTION

The manufacturing of window frames is a complex process. Broadly described, this process includes two parts. The first part comprises the cutting, machining and welding frame elements to form rectangular window frames. The second part includes the assembly of hinges, seals, locks, thermos panes, bug screens, and packaging for shipping.

The first part of the process, including the assembly of window frames, includes the most difficult operations in the manufacturing of vinyl and aluminum windows. This portion of the process is carried out in the frame machining and welding room. Long extrusions are handled over machinery and in tight spaces. These extrusions are set in jigs and are carefully aligned with the bed of each machine. Precise cutting, machining and welding are critical as dimension tolerances are very small. Verification of work quality requires frequent measurements and an extensive knowledge of all the extrusion profiles at hand. These operations require skills and concentration at all times to avoid errors.

In the past, several systems were developed to facilitate the machining of extrusions that are used in the window manufacturing industry. Some examples of the systems found in the prior art are:

U.S. Pat. No. 5,022,143 issued to J. J. Kautt on Jun. 11, 1991;
U.S. Pat. No. 6,294,044 issued to M. Schwaiger on Sep. 25, 2001;
U.S. Pat. No. 6,860,181 issued to P. Aubourg et al., on Mar. 1, 2005.

The first-mentioned document pertains to the assembly of hardware to a window frame. The second document pertains to the joining of frame elements, and the third document pertains to the collating of kits in the manufacturing of aluminium window frames. The collating of the frame elements is done after the cutting and machining of the frame elements.

It is believe that the most important improvements in the manufacturing of vinyl windows can be accomplished during the first part of the process as mentioned before, that is in the frame machining and assembly room. It has been found that most of the idle time and rejects are generated during the cutting of extrusions and the machining and welding of these extrusions into rectangular frames. After analysis of a typical window manufacturing plant, it has been found that the predominant areas of improvement in the plant were:

a) Idle time when searching for material;
b) Defects occurring during welding;
c) Dependence on employee absenteeism.

Idle Time: In a typical window manufacturing plant, a single worker can walk over a distance of 5,200 feet during the production of a single window box. These displacements include primarily the searching of frame elements and the transport of frame elements from inventory to and between work stations. As a consequence, a limited production of 10-12 window boxes per employee per 8-hr-shift has been considered in the past as an acceptable daily production.

Defects Generated During Welding: Although walking time in a manufacturing plant contributes greatly to overall waste, the welding of vinyl extrusions is known to generate numerous defects. Twin head welding machines for example, have different heat characteristics and different melt factors on different extrusion sizes. Both heads in a welding machine may also have different heat characteristics and different melt factors.

When a window frame is welded without taking the melt factors in consideration, the joints on that window frame may not be perfectly square. The amount of material that is melted in a joint is not consistent from one size of extrusion to the next, or from one side of the window frame to the other. As a consequence, the window frame does not have square joints. The opening panel will not fit in that frame, the thermos pane will not fit, and the bug screen will not fit. The brick molding will not fit around that frame either. Therefore, a window frame that is not symmetrical and square must be rejected as waste.

Twin head welding machines are the most popular equipment in the vinyl window frame manufacturing industry and therefore, manufacturers continue to have considerable amount of rejects due to improper welding.

Employee Absenteeism: Employee absenteeism is always a problem for manufacturers, and especially when several work stations depend on each other for a constant supply of workpieces through the plant. During the assembly of window frames for example, the machining of hardware-mounting slots and drain holes must be done before the frame elements are welded together, and the machining cannot start before these frame elements are cut to length. Therefore, the machining center is dependent on the output of the cut-off saw, and the welding machines are dependent on the flow of workpieces through machining center.

In view of these main areas of study, it is believed that there is a need for improvement in the cutting, machining and welding of vinyl window frames. There is still a need in this industry to reduce rejects and to improve productivity and quality.

SUMMARY OF THE INVENTION

In the manufacturing system and method according to the present invention for manufacturing window frames, there is provided a computer system and an array of boxes that are closely associated with addresses in a database of the computer system. This computer-box association is used to keep track of the sequence, placement and presentation of each window frame element to each workstation. This association is maintained until these frame elements are assembled into rectangular window frames. Then, individual window frames are tracked into other workstations using bar code labels.

In a first aspect of the present invention, there is provided a method for manufacturing window frames. As mentioned above, a cart with an array of boxes is associated with an array of addresses in a database of a computer. An order for window boxes is received and read by the computer. Dimensions of extrusions are extracted from this order. Machine and operators instructions are generated for cutting, machining and welding frame elements for making window frames for the order.

The operator and machine instructions are downloaded to a cut-off saw. The operator of the cut-off saw is instructed to cut frame elements from stock extrusions, and to place individual frame elements in a specific one of the boxes. When the cart is full of frame elements, it is moved to a machining center. Operator and machine instructions are downloaded to the machining center. Instructions to the operator of the machining center includes instructions to orderly handle each frame element from the boxes to the machining center and from the machining center back to its respective box.

When all frame elements in a cart have been machined, the cart is moved to a welding station. Operator and machine instructions are downloaded to a welding station. Instructions to the operator of the welding machine includes instructions to orderly handle the frame elements from the boxes and into a specific head of the welding machine.

During the entire process taking place in the machining and welding room, operator and machine instructions are individualized for each frame element such as to make it easier to the operators and such as to avoid mistakes and defects.

In another aspect of the present invention, there is provided a system for manufacturing window frame. This system includes a computer; several workstations and a cart for transporting window frame elements between the workstations. The cart has an array of boxes therein, each of these boxes has dimensions for receiving one window frame elements therein. The cart is movable between workstations. The computer has a database and this database includes an association of each of the window frame elements with a respective one of the boxes; operator instructions for handling each of the window frame elements in and out of the boxes at each workstations; machine instructions for machining each window frame elements; and welding instructions for welding each window frame elements to form window frames. In this system, operator instructions are reduced to the manipulation of frame elements on and off the different machines, basically.

In yet another aspect of the present invention, orders for window frames are grouped into batches of frame elements. These batches are accumulated as work banks before each workstations. Workstations are computer controlled, and instructions to operators are very elaborate. Workstations can operate independently of the other workstations or with reassigned operators for an extended period of time, which make these workstation less dependent on absenteeism in the plant.

In a further aspect of the present invention, there is provided a method for welding a vinyl window frame on a twin-head welding machine. This method includes the steps of:
  determining the melt factor of each head in the welding machine;
  determining a placement of individual end of each frame element in a window frame in a respective head in the welding machine;
  adjusting a length of each of these individual end of each frame element for compensating for the melt-factor of that respective head,
  placing the individual end of the frame element in the respective head of the welding machine and welding that end to another end of another frame element, forming a joint in the window frame.

As a result, the time required for machining and assembling each window frame is significantly reduced. Defects from welding is also significantly lower. For example, the material searching time and employee walking time has been mostly affected. Whereas a worker used to walk over a distance of 5,200 feet per window box, this distance has been reduced to less than 300 feet per window box per employee. Average production has been doubled, to 25 window boxes per employee per 8 hr. shift.

As it may be appreciated, such an improvement in efficiency has been accompanied by a reduction in human errors, and an improvement in employee satisfaction.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

A preferred embodiment of the present invention is illustrated in the accompanying drawings; in which.

DESCRIPTION OF THE PREFERRED EMBODIMENT

Figure 1:
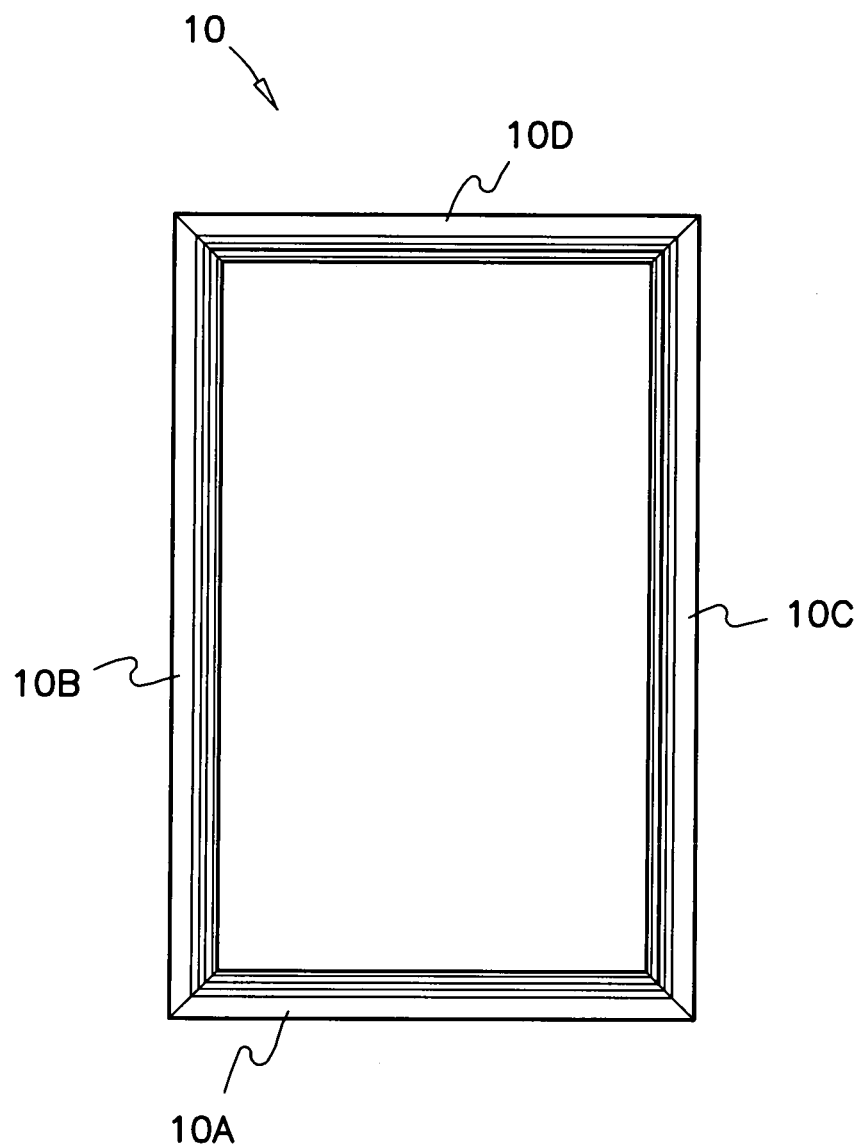
FIG. 1 is an elevation view of a typical window frame.

Referring to FIG. 1, a typical window frame 10 is illustrated therein for reference. For the purpose of keeping track of the elements in a window frame, label 10A is assigned to the window sill; labels 10B and 10C are assigned to the left and right side members respectively; and label 10D is assigned to the header of the window frame. This labeling is used by the computer system and by the plant personnel to keep track of the location of each frame element during manufacturing. This labeling is also used to assign machining instructions required to work each frame element.

Referring now to FIGS. 2, 3 and 4A-4D simultaneously, the preferred system and method according to a preferred embodiment of the present invention will be described.

Orders are received and logged in a computer system. This computer system is managing the companies' accounting, sales records and production. The logic diagram in FIGS. 4A-4D explain the different steps involved in the software that is used in the preferred method and system.

The portion of this computer system that is of interest herein is the portion that pertains to production. That portion starts at step 100 in FIG. 4A. More particularly, the portion that is of interest herein is the cutting and machining of frame elements and the welding of these frame elements into a rectangular window frames as shown in FIG. 1 for example. The remaining steps in the process for manufacturing window boxes include other innovations that may be best described in other documents. These remaining steps are not the focus of the present invention, and therefore, they are not explained in great details herein.

The logic diagram that is illustrated in FIGS. 4A-4D, explains steps that are carried out inside the computer processor and steps that are carried out on the production floor by operators and by machines. The diagram has been prepared this way to facilitate the understanding of the preferred manufacturing system.

Orders for window boxes are received and sorted by expected delivery dates. Orders are analyzed at step 101 to determine the stock material that is required, and whether or not the material is available. When stock material needs to be ordered, this is done at that time. However, a good inventory of all standard frame elements is preferably kept at the plant at all times.

Each order is analysed by the computer system and a database is generated. Each order is separated into types of extrusions, at step 102. The computer system forms convenient-size batches of "N" window frames to be handled in the frame machining and welding room. Two or more orders may be grouped together to form a convenient-size batch, in step 103.

A typical convenient-size batch of "N" window frames would comprise 45 window frames for example. The convenient-size batch "N" is determined by taking into account machine set-up time, jig set-up time, and storage space for the work in progress. In the database, similar frame elements are grouped together into production "runs", in step 104.

The computer keeps track of the location of each frame element throughout the machining and welding room. The method and system used to keep track of each frame element in the machining and welding room will be understood from the following description of the different machines and workstations included in the machining and welding room.

Main Fabrication Line

Figure 2:
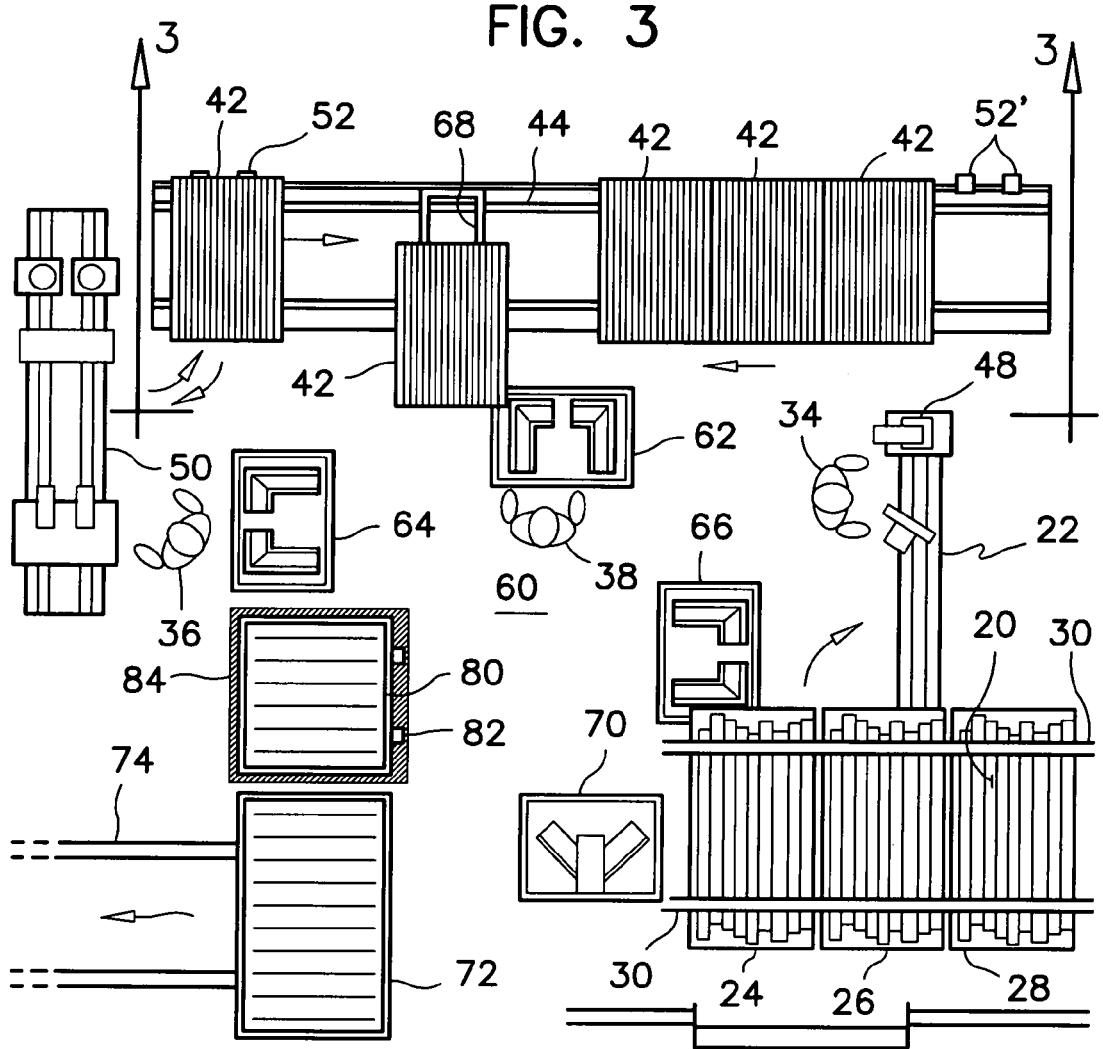
FIG. 2 is a schematic plan view of the frame machining and welding room.

At a first workstation, as illustrated in FIG. 2, the stock extrusions 20 are cut to length in a computer-controlled cut-off saw 22. Full-length stock extrusions 20 are stored in several overhead trolley wagons 24, 26, 28 that are hung to rails 30 above the bed of the cut-off saw 22. The overhead trolley wagons 24, 26, 28 are large enough to contain extrusion profiles 20 for several days of full plant production. The overhead trolley wagons 24, 26, 28 are mounted next to an access door 32 in the building so that these trolley wagons can be re-loaded easily with full-length extrusions using a forklift truck for example moving through that door 32.

The computer file that is downloaded to the cut-off saw 22 requires an operator 34 to cut all the extrusion types in a production "run" from a first trolley wagon 28 for example, before moving that first trolley wagon 28 aside and cutting a second type of extrusions from a second production "run" from the next trolley wagon 26 and then 24 and so on. When extrusions from all trolley wagons have been cut, the computer file that is downloaded for the next batch will ask the operator 34 to cut the extrusions in the reverse order; that is from the trolley wagons 24, 26, and 28, such as to improve efficiency. Preferably, a total of five trolley wagons are used for providing a combined total storage space for two weeks of production.

The computer file or database that is downloaded to the cut-off saw 22 includes machine instructions to cut each extrusion along the proper angle and at the proper length, and instructions to the operator 34 of the cut-off saw to place each cut frame element in a specific orientation into a specific box 40 in a storage cart 42.

As it may be understood, the computer file that is downloaded to the cut-off saw 22 contains a grouping of similar lengths of a same extrusion type. These sub-grouping within each batches of "N" window frames constitute the aforesaid production "runs".

Therefore, it is common to cut from a work batch of 45 window frames for example, a side member for window frame #5 in the batch, and then cut a side member for window frame #23, and then another frame member for window frame #33, and so on, until all similar extrusions have been cut. The cutting appears to be done randomly, but at the end of the batch, all frame members for the batch of window frames are accounted for in the carts 42.

Several storage carts 42 are mounted on rails 44 and are driven along the rails by conveyor chains (not shown). These carts 42 are moved along the rails 44 and are parked at each workstation. In the preferred embodiment, each cart contains fifteen columns each containing four boxes 40 stacked on top of each other. A parking sign 46 at the cut-off saw 22 shows the numbers from 1 to 45. In use, three carts 42 are moved to this workstation 22 and the columns are aligned with the numbers on the parking sign 46.

As mentioned, the computer file or database that is downloaded to the cut-off saw 22 includes instructions to the cut-off saw 22 to cut each extrusion at the proper angle and length. This computer file tells the operator 34 of the cut-off saw 22 to place each cut extrusion in a specific orientation into a specific box 40 in one of the three storage carts 42. One example of a proper placement of the frame element 20 in each box 40 is: a window sill member 10A is to be placed in the lower box; the left side extrusion 10B goes into the second box 40; the right side extrusion 10C goes into the third box 40 and the header goes into the fourth or the top box 40. Each column of boxes 40 contains the extrusions required to fabricate one window frame 10.

The instructions to the operator 34 of the cut-off saw also include an instruction to place the extrusions with their exterior surface facing right or left inside its respective box 40. The placement of each extrusion in each box 40 facilitates the handling of these extrusions by the operators of downstream workstations. A right side frame element would have its outside surface facing to the right, and a left side frame element would have its outside surface facing to the left for example.

A bar code label is made available at the bar code printer 48. The bar code printer is mounted above the cut-off saw 22. The bar code label is affixed to the outside surface of each frame element by the operator 34 of the cut-off saw, before these frame elements are placed in their respective box 40.

When a first batch of "N" window frames has been completed at the cut-off saw 22, a train of three carts 42 is moved along the rails 44 to the second workstation; that is the machining center 50. The computer file that is downloaded to the machining center 50 contains instructions to the operator 36 regarding the sequence and location of each piece to be taken from a cart 42; the placement of that piece on the machine 50, and instructions to the machine 50 to cut slots and to drill holes where required on that piece. The operator 36 is also instructed to place the finished extrusion exactly the same way as it was taken from its respective box 40.

When the machining of all the extrusions 20 in one cart 42 has been completed at the machining center 50, that cart 42 is moved upward by a first elevator 52 onto a second level of the previously-mentioned conveyor. Carts 42 on this upper level are moved along rails 44' to the welding station 60.

The preferred welding station 60 comprises three welding machines 62, 64, 66. Each welding machine in the preferred installation is a twin head type machine, although four head machines can also be used. Each machine is set up with jigs for specific extrusion profiles. The designation of these welding machines to perform welds on specific window frames will be better understood later when describing the welding machine operations.

In order to further facilitate the operator's task at the welding workstation 60, each cart 42 preferably has transverse slides 68 there under and each cart 42 can be moved perpendicularly from the rails 44' to be brought closer to the welding machines 62, 64. This provision also saves work and production time. The display screen at the welding station instructs the operator 38 to place each frame element in the welding machine that has been selected for that extrusion type. The instructions to that operator 38 also includes instructions to place each extrusion under the welding head for which the length of that extrusion has been adjusted, as it will be explained later.

After a cart 42 has been emptied at the welding station 60, the empty cart 42 is returned back inline with the rails 44' and moved toward the cut-off saw 22 on the upper deck of the conveyor. A second elevator 52' brings the cart 42 back to the lower level to be used again at the cut-off saw workstation 22.

The welds on each window frame are cleaned in a weld-cleaning machine 70. Then, each window frame is stacked vertically in a side-by-side order on a first transfer dolly 72. The first transfer dolly 72 is movable on another conveyor 74. This other conveyor 74 carries the window frames to other workstations in the manufacturing plant. Tracking off each window frame in the plant is done thereafter using bar code readers at the other workstations.

For information purposes, the additional workstations that are required to manufacture complete window boxes include: Hardware Installation; Thermos Installation; Brick Molding Installation; Bug Screen Fabrication and Installation; and Thermos Inspection and Sorting. The bar code label that is affixed to each window frame at the cut-off saw 22 is also used to track the location of each window frame in the plant's shipping warehouse.

Because the cut-off saw 22 and the machining center 50 are computer-controlled, and because of the exact placement of all the extrusions in respective boxes 40, a same operator can operate both machines. That same operator can also operate all three welding machines. Because of the grouping of identical extrusion profiles within a same batch of window frames in a production run, changes of jigs and fixtures at every machine are minimized. As a result, this manufacturing system is more efficient than all known prior art systems.

Brick Molding Line

The machining and welding room includes a parallel line that is used to fabricate brick moldings when required in an order. The extrusions required to make these brick moldings are cut to length on the cut-off saw 22 and are placed in the transfer carts 42. If machining is required, they are transported in one of the carts 42 to the machining center 50. The cut extrusions are then welded on the welding machine 66. This welding machine 66 is equipped with a jig that is made for brick molding extrusion, and that jig is left on that machine as much as possible. In other words, this welding machine 66 is dedicated to do joints on brick moldings frames only.

The welds are cleaned on the weld cleaner 70, and the assembled and cleaned brick molding frames are placed on a second transfer dolly 80 for transport directly to the brick molding mounting station. In the preferred installation, the second transfer dolly 80 is mounted to an elevator 82 for movement through an opening 84 in the floor of the machining and welding room. From there, it is conveyed to the brick molding mounting station.

Bypass Line

Figure 3:
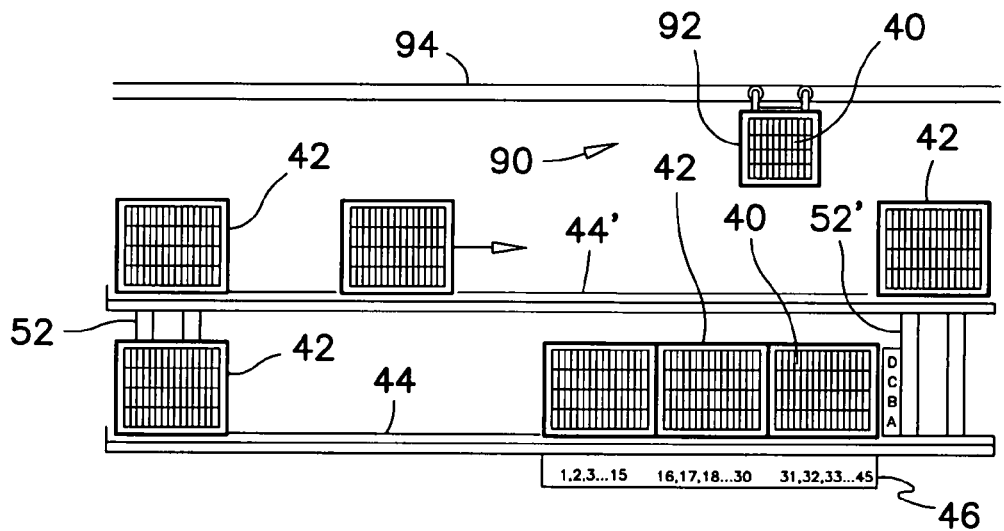
FIG. 3 is a schematic elevation view of a conveyor system for carrying frame elements throughout the frame machining and welding room, as seen along line 3-3 in FIG. 2.

Referring to FIG. 3, a by-pass line 90 comprises a bypass cart 92 that is similar to but with less compartments 40 than the previously mentioned carts 42. The cart 92 is hung to rails 94 that are attached to the ceiling of the machining and assembly room. The cart 92 follows the same path as carts 42 between the cut-off saw 22, the machining center 50 and the welding station 60. This by-pass line 90 is used to manufacture small orders and replacement frames that may be required from time to time at a downstream station, to replace a defective frame in an ongoing order, for example.

Twin Head Welding Machines

As mentioned before, twin head welding machines have a specific melt factor for each extrusion profile. These melt factors must be known and understood to ensure consistent work quality. All three welding machines 62, 64, 66 have been tested with different extrusion sizes. Their welding heads have been tested independently. The characteristics of these machines have been noted.

Referring back FIGS. 4A to 4D, the preferred computer system controlling the fabrication process will be explained. At step 105 and 106, the computer determines from the aforesaid production "runs", the type of extrusion that has been selected for each frame element. These frame elements are grouped in three types. The first type is a larger extrusion that is used for the outside frame of a window box. The second type is a smaller extrusion that is used for the framing of the movable panels inside a window frame. The third type is a smallest extrusion that is used as a brick molding as mentioned before. A determination is made to assign the welding of each extrusion to a specific head in a specific welding machine.

In steps 107 to 110, the computer uses a sub-routine to defines the dimensions of the frame elements and to adjust the cutting instructions to leave the exact amount of material that is required to weld all four joints in the window frame. The computer also adjusts the machining instructions to compensate for the added material and adjusts the weld time, temperature and jig displacement of the selected welding machine for performing an ideal weld on each joint in each window frame.

While the cutting instructions to the cut off saw 22 may contains a single total length adjustment to compensate for the weld factors of both joints in a same extrusion, the instructions to the machining center take into consideration individual melt-factor for each end of each extrusion. The machining of slots and holes in each frame element remains true relative to a mid-point along each frame element.

Then the computer programs resumes its regular flow in steps 111 and 112. These instructions are stored in the computer's memory for timely download to workstations as machine and operator instructions.

Operator and machine instructions are downloaded to the cut-off saw 22 in step 113. At that time, the instructions to the bar code printer 48 and the corresponding feedback are registered in a database in steps 114 and 115.

In step 116 the operator 34 at the cut-off saw 22 receives instructions to cut frame elements to fulfill the entire batch of "N" window frames. Once the batch is completed, the bank of frame elements is moved to the machining center 50 in step 117. Machine and operator instructions are downloaded to the machining center in step 118, and again frame elements for a bank of "N" window frames are accumulated in the transfer carts 42, in step 119, for transfer to the welding station 60.

In steps 120-121, operator and machine instructions are downloaded to the respective welding machines 62, 64, 66 for joining the frame elements and making window frames. Each frame element is assigned a specific head in a specific welding machine, such that the weld melt factor is known and is as planned.

The joints are cleaned in step 122 and the window frames are loaded onto the first and second transfer dollies 72 and 80, in step 123, for transport to other workstations.

Absenteeism

In the present manufacturing system, it is possible to achieve a normal production with less than full staff. The operator's instructions are downloaded to each workstation on a display screen so that minimum training is required to operate the workstations. Every step of every operation to be done to every frame element is displayed and explained. The operators' tasks at every workstation are reduced to the manipulation of the extrusions on and off the machines basically. When an operator has learned the sequence of operation of each workstation, that operator can operate each workstation.

Because of the accumulation of frame elements in batches of "N" window frames between the cut-off saw and the machining center and between the machining center and the welding station, the cut-off saw and the machining center can stay without an operator for a period of time without interrupting the work flow to and from the welding station.

Figure 4A:
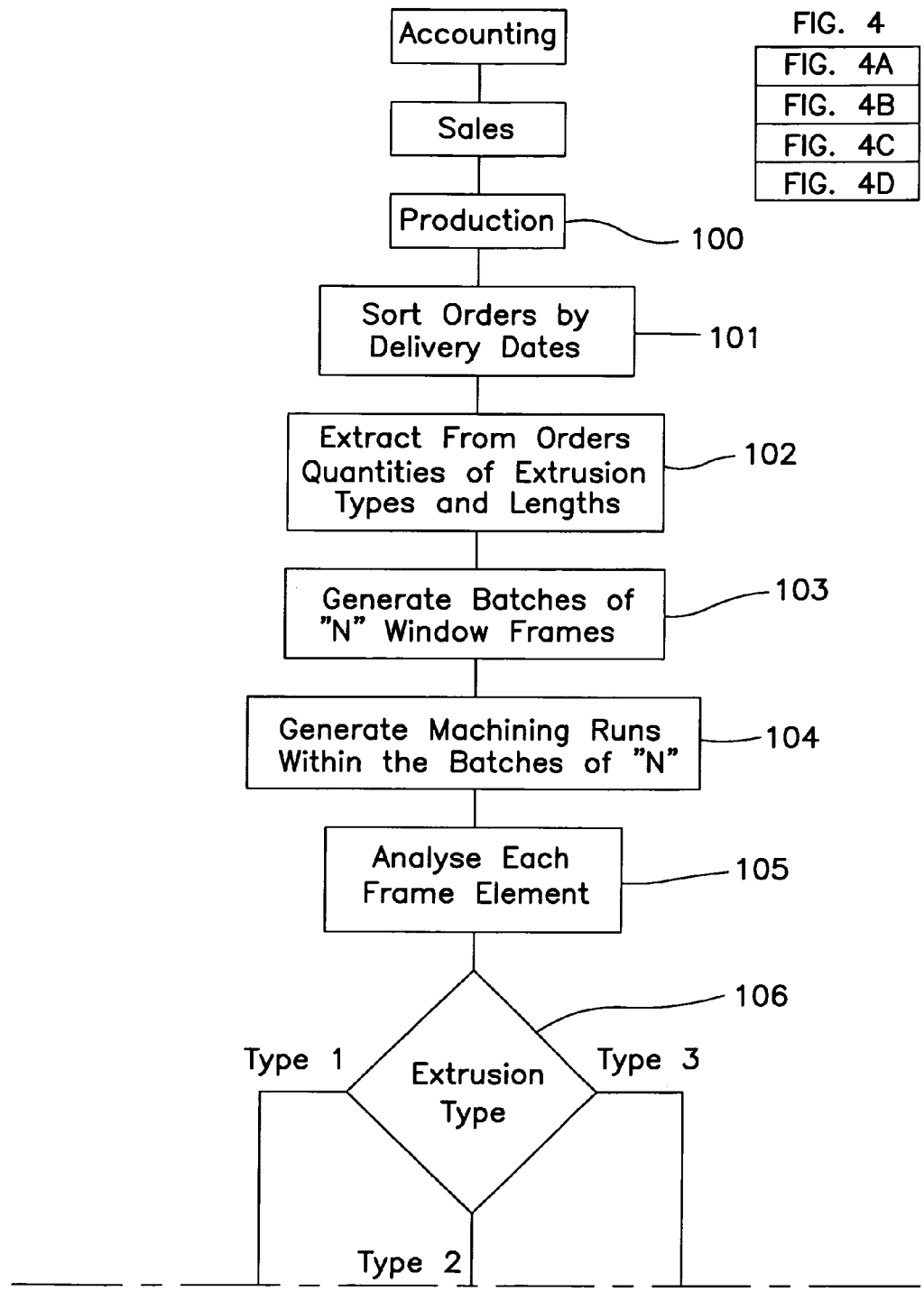
FIGS. 4A, 4B, 4C and 4D are four partial views, jointly forming an entire view of a logic diagram explaining the computer program that is used to control manufacturing equipment in the window frame machining and welding room.
Figure 4B:
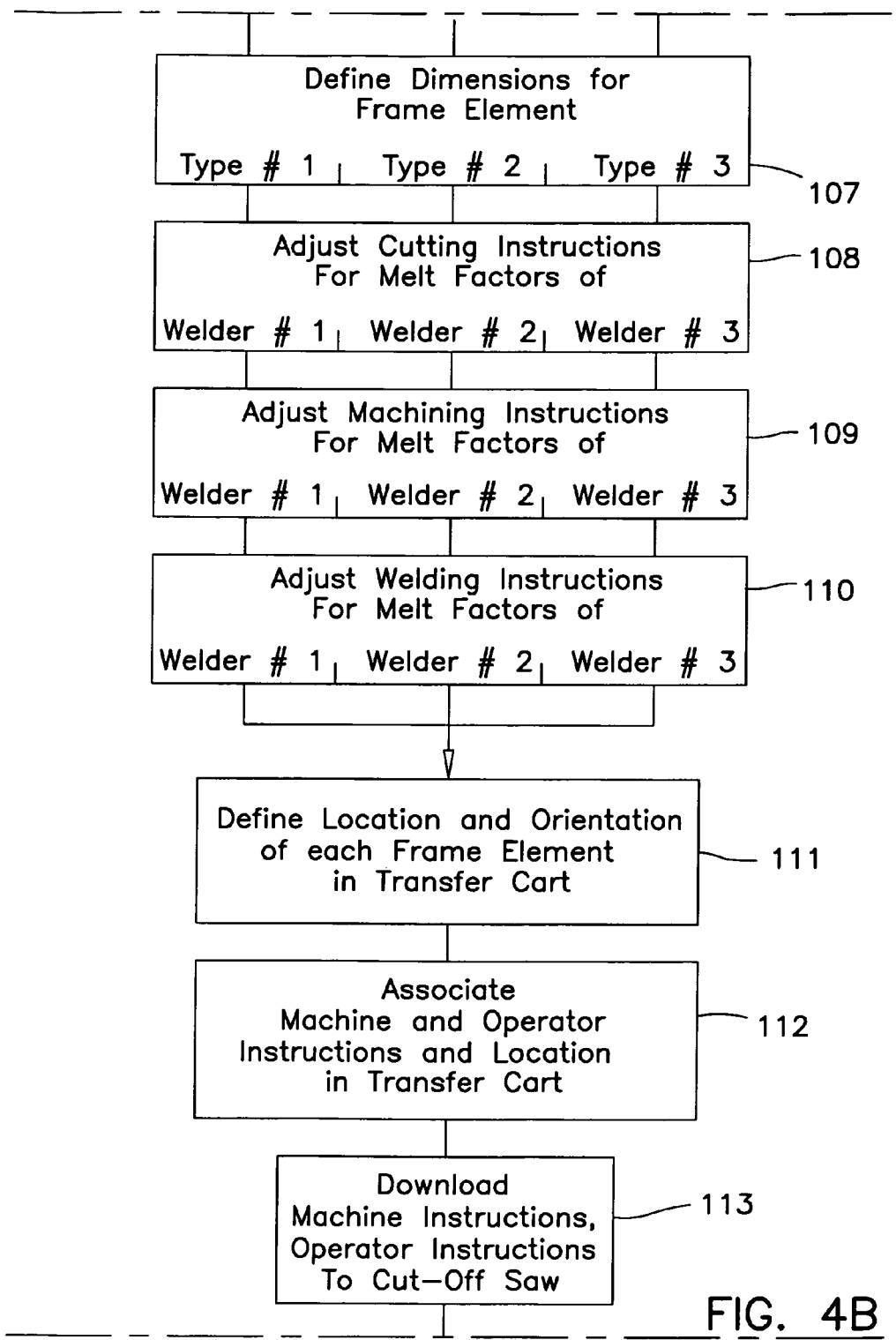
Figure 4C:
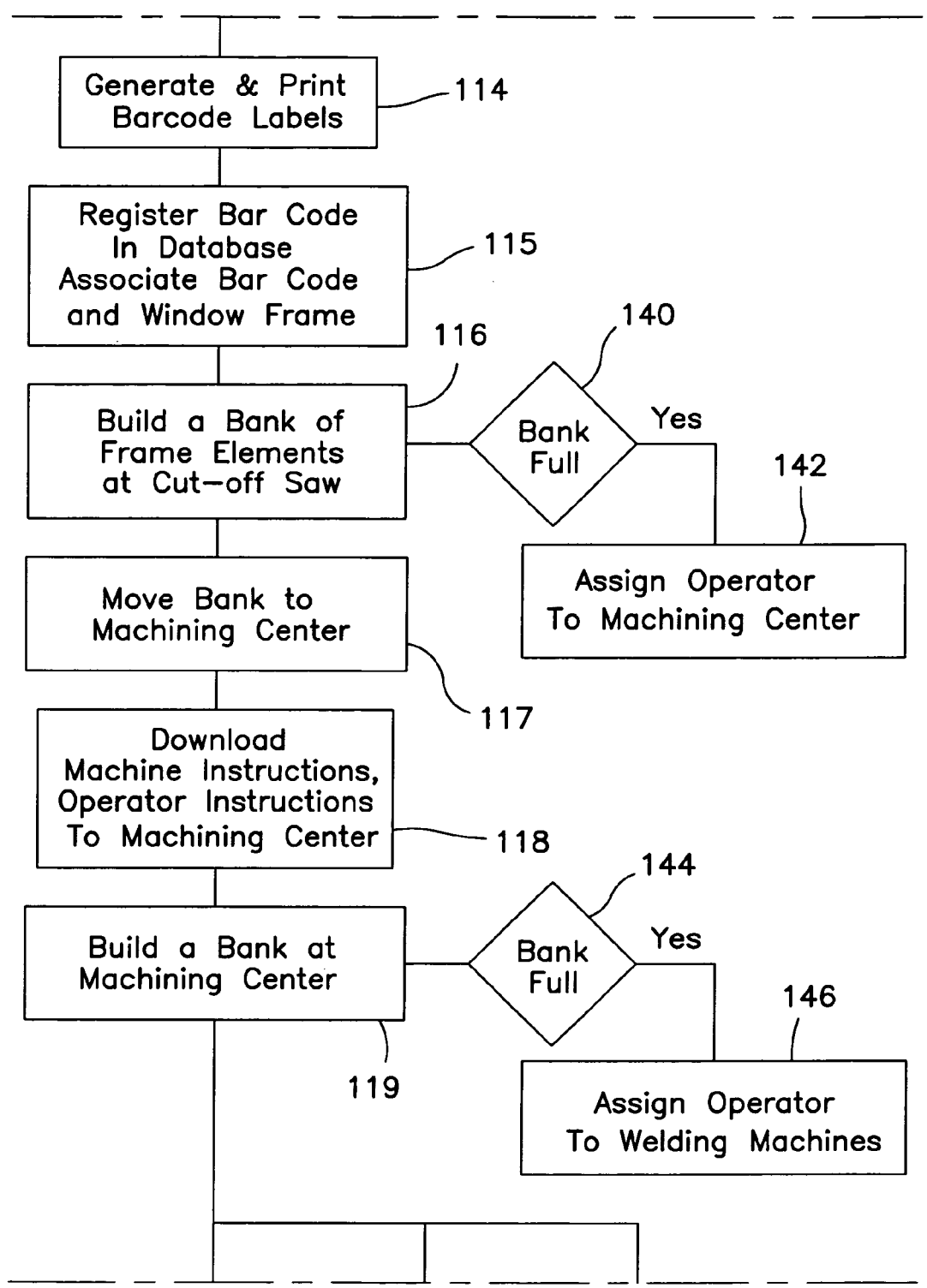
Figure 4D:
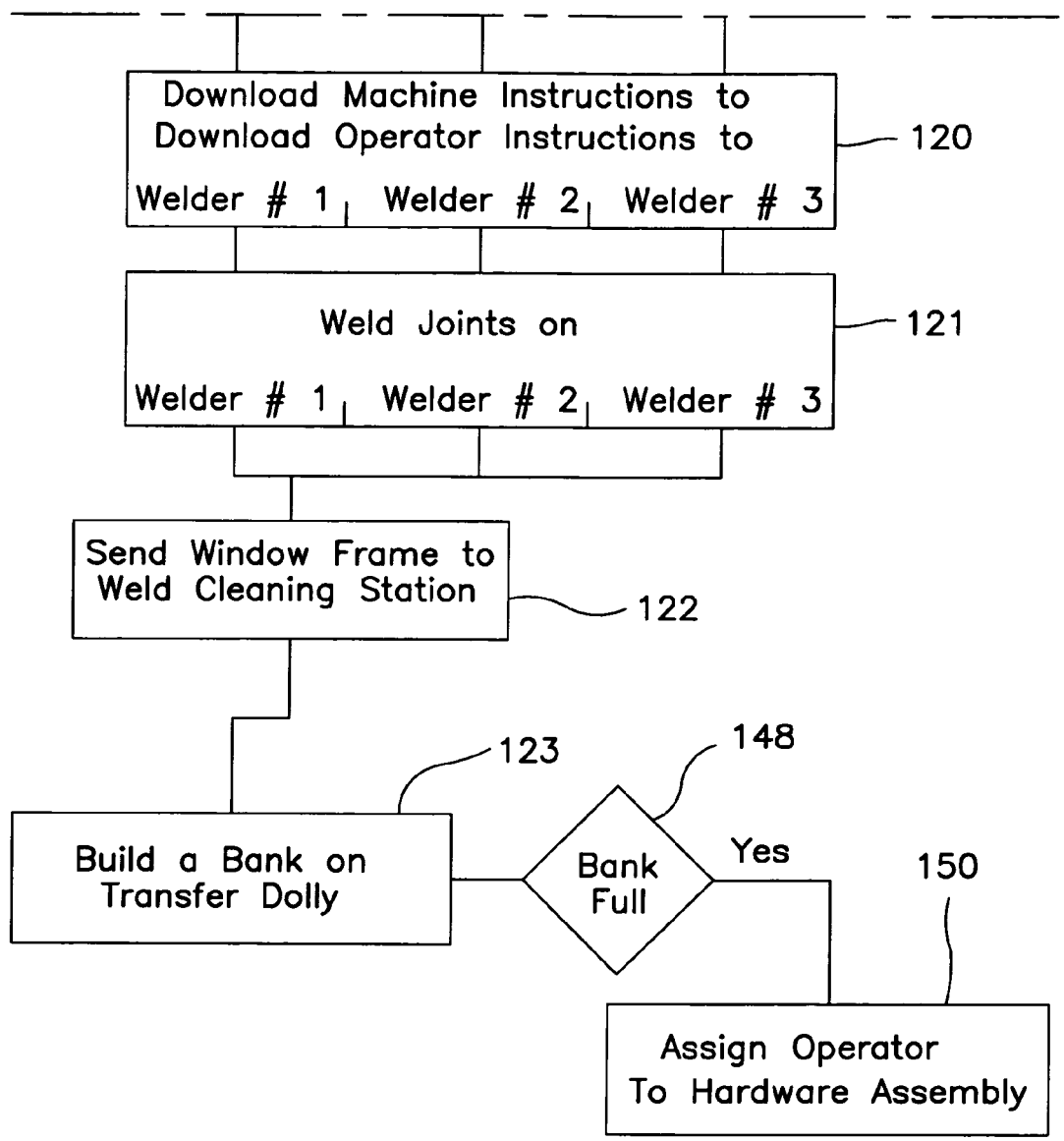

This process may be better explained by looking at FIG. 4C. During step 116, the computer program keeps count of production and the batch size "N". When the bank is full, as in steps 140,142, the computer directs the operator 34 of the cut-off saw to be reassigned to the machining center 50 to help production at the machining center. Similarly, when the bank is full at the machining center as explained by steps 144, 146, the operator is reassigned to the welding station 60 to help at that location.

When the bank of "N" window frames has been reached on the transfer dollies, at steps 148, 150, the operator is reassigned somewhere else in the plant to help at a downstream workstation, or is reassigned to the cut-off saw 22.

The batch size of "N" window frames can be adjusted from one day to the next according to the absenteeism in the plant, according to equipment maintenance schedule, inventory size, urgency of orders, and other similar variables. Under the present manufacturing system, operators are more flexible to work at several workstations. For example three operators can manage the four workstations in the machining and assembly room, if there is a need for it. Bank sizes for two days of production can be made. Absenteeism is no longer an impediment to a steady production. The overall productivity of the plant is greatly improved.

As to other details of fabrication and operation of the present cover, the same should be apparent from the above description and accompanying drawings, and therefore, no further description is deemed necessary.

What is claimed is:

1. A window frame manufacturing system comprising a computer;
    several workstations connected to said computer and a storage cart for transporting window frame elements in an orderly manner between said workstations;
    said storage cart having columns of boxes therein;
    each of said columns being identifiable by numbers;
    each of said columns of boxes containing frame elements for making one window frame;
    said frame elements for making one window frame comprising at least one right side member having a right outside surface, and one left side member having a left outside surface;
    all of said right side members in said storage cart being stored at a first box height along said columns of boxes, and
    all of said left side members in said storage cart being stored at a second box height along said columns of boxes;
    said storage cart being movable between said workstations,
    said computer having a database and said database comprising:
    an association of each of said window frame elements with a respective one of said boxes in said storage cart;
    operator instructions for handling each of said window frame elements out and in one of said boxes at said workstations; some of said operator instructions comprising instructions relating to said columns being identifiable by numbers and said first and second box heights along said columns;
    machine instructions for machining each of said window frame elements;
    welding instructions for welding each of said window frame elements.

2. The window frame manufacturing system as claimed in claim 1, further comprising a display screen at each of said workstations for displaying said operator instructions to an operator at each of said workstations.

3. The window frame manufacturing system as claimed in claim 1, further comprising a series of trolley wagons containing stock extrusions therein movably mounted above a first one of said workstations.

4. The window frame manufacturing system as claimed in claim 1, wherein said storage cart is mounted on a conveyor extending between said workstations.

5. The window frame manufacturing system as claimed in claim 4, wherein said storage cart is a train of storage carts containing a bank of said window frame elements.

6. The window frame manufacturing system as claimed in claim 5, wherein said train of storage carts forms a bank of frame elements upstream of at least one of said workstations.

7. The window frame manufacturing system as claimed in claim 6, wherein said bank of frame elements corresponds to one day of production at said workstation.

8. The window frame manufacturing system as claimed in claim 1, further comprising a cut-off saw and a bar code printer on said cut-off saw for printing bar code labels and for identifying each of said frame elements by one of said bar code labels, and said cut-off saw and said bar code printer being mounted upstream of said storage cart.

9. The window frame manufacturing system as claimed in claim 1, wherein each of said right side members having a bar code label affixed to said right outside surface thereof,
    each of said left side members having a bar code label affixed to said left outside surface thereof;
    each of said right side members in said storage cart having said right outside surface thereof and a respective one of said bar code labels facing toward a right side of said storage cart, providing a first visual indicator of an orderly placement of said right side members in said boxes and in said storage cart;
    each of said left side members having said left outside surface thereof and a respective one of said bar code labels facing toward a left side of said storage cart, providing a second visual indicator of an orderly placement of said left side members in said boxes and in said storage cart; and
    said operator instructions for handling each of said window frame elements further comprise indications relative to said visual indicators on said right side members and on said left side members.

10. The window frame manufacturing system as claimed in claim 1, wherein said storage cart contains a first number of said columns of boxes;
    said storage cart is movable along a first path at a first elevation between said workstations; and further comprising a bypass cart containing a second number of said columns of boxes therein; said second number of said columns of boxes being fewer than said first number of columns of boxes, said bypass cart being movable along said first path between said workstations, at a second elevation above said first elevation.

11. The window frame manufacturing system as claimed in claim 10, wherein said storage cart is mounted on rails extending along said first path, and further comprises a transverse slide there under for movement of said storage cart toward one of said workstations in a direction extending at right angle from said first path.

12. The window frame manufacturing system as claimed in claim 10, wherein said first path has a first and second ends, and further comprising a storage cart return path extending above said first path, and a first elevator at said first end of said first path extending between said return path and said first path for transferring said storage cart from said return path to said first end of said first path and a second elevator at said second end of said first path extending between said first path and said return path for transferring said storage cart from said second end of said first path to said return path.

\* \* \* \* \*